United States Patent [19]

Clemens

[11] Patent Number: 4,962,442
[45] Date of Patent: Oct. 9, 1990

[54] FREE-STANDING STANCHION FOR SUPPORTING AND PROTECTING ELECTRONIC DEVICE PACKAGES ON CIRCUIT BOARDS

[75] Inventor: Donald L. Clemens, The Colony, Tex.

[73] Assignee: Thermalloy Incorporated, Dallas, Tex.

[21] Appl. No.: 501,784

[22] Filed: Mar. 30, 1990

[51] Int. Cl.$^5$ .......................... H05K 1/18; H05K 7/12
[52] U.S. Cl. ................................. 361/403; 174/138 G
[58] Field of Search .................. 174/138 G; 361/403; 248/500, 505, 510

[56] References Cited

U.S. PATENT DOCUMENTS

| | | |
|---|---|---|
| 3,241,094 | 3/1966 | Harton .................. 174/138 G X |
| 4,219,172 | 8/1980 | Murayama ............... 174/138 G X |
| 4,254,301 | 3/1981 | Serino ..................... 174/138 G |
| 4,589,794 | 5/1986 | Sugiura et al. ............ 174/138 G X |
| 4,847,449 | 7/1989 | Jordan et al. ............. 174/138 G |

Primary Examiner—Laramie E. Askin
Attorney, Agent, or Firm—Richards, Medlock & Andrews

[57] ABSTRACT

A stanchion having a base with holes passing therethrough is used to hold elongated electronic device packages in a vertical position during assembly of a circuit board. The leads extending from the end of the device package are positioned in the holes in the base and the device package retained in the vertical position by attachment arms extending upwardly from opposite sides of the base defining a cavity for receiving the device package. Legs extending from the base support the device package above the surface of the circuit board to permit cleaning of the assembly.

9 Claims, 1 Drawing Sheet

U.S. Patent  Oct. 9, 1990  4,962,442
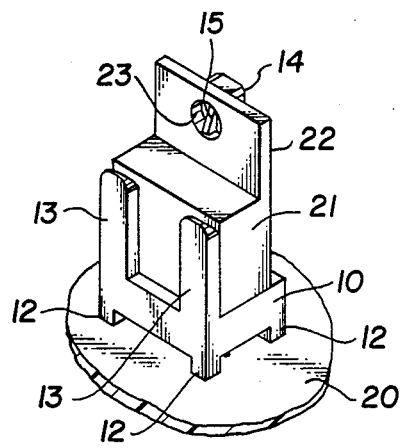
Fig. 1
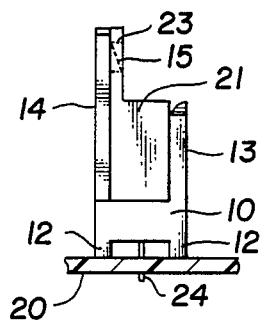
Fig. 2
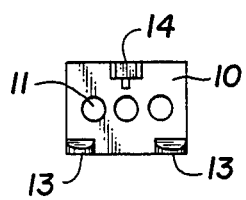
Fig. 3
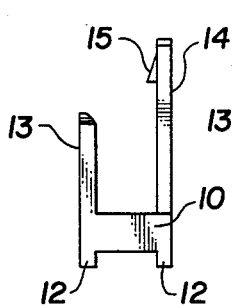 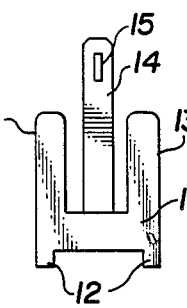 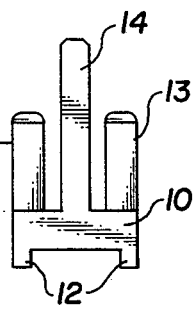
Fig. 4  Fig. 5  Fig. 6
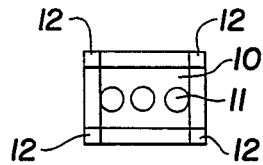
Fig. 7

FREE-STANDING STANCHION FOR SUPPORTING AND PROTECTING ELECTRONIC DEVICE PACKAGES ON CIRCUIT BOARDS

FIELD OF THE INVENTION

This invention relates to circuit board assembly. More particularly, it relates to a stanchion for supporting electronic device packages and aligning the leads extending from the device package with interconnection means such as holes or mounting pads on the surface of a circuit board to assure proper lead alignment during the assembly process and to protect the leads from mechanical stress or unintentional bending in the final assembly.

BACKGROUND OF THE INVENTION

Electronic device packages are positioned on and secured to circuit boards in various ways to produce circuit board assemblies. Conventionally, leads extending from the device package are inserted into holes in the circuit board and soldered to circuit patterns on the undersurface of the board by wave soldering or the like. In surface-mount assemblies, the leads are positioned on attachment pads on the top surface of the board and soldered thereto.

To conserve costs, it is preferable to position the device packages on the board by robotic techniques. However, where robotics are used, accurate pre-alignment of the leads with the holes or mounting pads must be assured.

In many applications, density of components on the circuit board is a major consideration. Accordingly, elongated packages are mounted vertically when practical to conserve surface area. Unfortunately, many elongated packages (such as the TO-220 package and similar packages) are not symmetrical or evenly balanced. Thus they tend to tilt from the vertical position before or during the soldering process unless restrained.

SUMMARY OF THE INVENTION

The present invention provides a free standing stanchion for supporting elongated device packages vertically during the assembly process. The stanchion includes a base portion through which the device package leads are inserted to assure proper lead alignment. The base also provides a barrier to prevent wicking of solder and provides legs to support the device package above the surface of the printed circuit board to permit postassembly cleaning. The stanchion remains permanently attached to the device package to protect the leads from bending and other undesired stress. Other features and advantages of the invention will become more readily understood from the following detailed description taken in conjunction with the appended claims and attached drawing in which:

DESCRIPTION OF THE DRAWING

FIG. 1 is a perspective view of an assembly of an electronic device package on a circuit board using the red embodiment of the stanchion of the invention;

FIG. 2 is a side elevational view of the assembly of FIG. 1;

FIG. 3 is a top plan view of the stanchion of FIG. 1;

FIG. 4 is a side elevational view of the stanchion of FIG. 1;

FIG. 5 is a front elevational view of the stanchion of FIG. 1; FIG. 6 is a back elevational view of the stanchion of FIG. 1; and FIG. 7 is a bottom pan view of the stanchion of FIG. 1.

DETAILED DESCRIPTION

A typical assembly of an electronic device package on a circuit board using the stanchion of the invention is illustrated in FIGS. 1 and 2. It will be recognized that only a small broken away portion of the circuit board is shown and only a single device assembly is illustrated.

In the preferred embodiment the stanchion comprises a base portion 10 which has oppositely disposed first and second surfaces. Base 10 has a plurality of apertures 11 (three of which are shown in the embodiment illustrated) passing transversely therethrough. It will be recognized that the number, size and spacing of the apertures 11 will be predetermined to accommodate the leads extending from the electronic device package to be used in connection with the stanchion. In the preferred embodiment, the base 10 is rectangular in dimensions since most electronic device packages are likewise rectangular in end view. Legs 12 extend from the lower face of the base 10, preferably positioned at the corners thereof, and are of uniform length and adapted to support the stanchion on the surface of a printed circuit board 20. The first and second opposed faces of base 10 are aligned substantially parallel with the surface of the printed circuit board 20 and the legs 12 support the lower or second face thereof spaced from the surface of the circuit board 20. Attachment members in the form of elongated arms extend from the top face of the base 10 to define a cavity for receiving the electronic device package. In the embodiment illustrated, the attachment means comprise a pair of spaced apart upwardly extending arms 13 positioned to extend substantially vertically from one edge of the top face of base 10 and a parallel latching arm 14 extending upwardly vertically from the opposite edge of the top face of base 10.

Parallel arms 13 and latching arm 14 are, as illustrated, positioned on opposite sides of the top face and extend vertically in an opposed relationship defining a cavity therebetween for receiving the electronic device package as illustrated in FIG. 1. It will be readily recognized that the configuration and spacing of the arms 13 and 14 can be varied as desired to accommodate various physical configurations of electronic device packages. The preferred embodiment illustrated in the drawing is specifically adapted to accommodate TO-220 device package as illustrated in FIG. 1 and FIG. 2. The TO-220 device package comprises a package body 21 which is rectangular in dimensions and has a heat sink tab 22 extending from one end thereof. Heat sink tab 22 has an aperture 23 centrally located near the extreme end thereof. The aperture 23 in a conventional TO-220 package is intended for use in securing the heat sink tab 22 to an external heat sink, chassis or the like. In order to rigidly retain the electronic device package in a vertical orientation and confined within the cavity of the stanchion defined by arms 13 and 14, latching arm 14 includes an inwardly projecting tongue 15 positioned and adapted to mate with aperture 23. The typical TO-220 package has three leads 24 extending from, the opposite end of the package. As illustrated in FIGS. 1 and 2, the TO-220 package is inserted between arms 13 and 14 with its leads 24 aligned with and extending through the apertures 11 in base 10. When the end of the package from which the leads extend contacts the upper face of base 10, tongue 15 extends into aperture 23 to securely latch the device package within the stanchion. The stanchion and electronic device package may then be handled as a unit, either manually or robotically, to be positioned on the circuit board 20. The subassembly may then be positioned as desired on the surface of a circuit board 20 to position the leads 24 so that they extend through matching holes in the surface in the circuit board as illustrated in FIG. 2.

It will be observed that with the leads 24 extending through holes in the circuit board, the legs 10 12 rest on the surface of the circuit board and support the lower face of the base 10 parallel with but spaced from the surface of the circuit board. Since the legs 12 are positioned at the corners of base 10, the stanchion provides a stable support for the electronic device package and aligns the leads 24 with the holes in the circuit board while supporting the electronic device package vertically. The leads may then be soldered to circuit patterns on the underside of the circuit board by conventional techniques such as wave soldering or the like.

During the soldering and associated handling processes, the stanchion supports the electronic device package in the desired vertical arrangement. Furthermore, after the leads have been soldered to the circuit board, the stanchion provides protection for the electronic device package. For example, if an unprotected device package extending vertically is accidentally struck, the entire force of the blow is transmitted to the solder connection between the leads and the circuit board, thus causing extreme stress to the leads. Undesired stress on the leads may not only affect the lead/solder bond, such stress may also adversely affect the interconnection of the leads with the electronic device contained within the electronic device package. However, with the stanchion of the invention in place as illustrated in the drawing, stress applied to the electronic device package is absorbed by the legs 12 which maintain the device package in its vertical orientation without permitting the stress to be passed to the leads 24.

While the preferred embodiment has been specifically described in connection with an electronic device package such as a TO-220 package which has leads extending through a circuit board, it will be readily recognized that the principles of the invention may be applied to stanchions for various other shapes and sizes of electronic device packages. Furthermore, the stanchion may be used in connection with electronic device packages which have leads attached to the top surface of the printed circuit board by surface-mount techniques. From the foregoing, it will be observed that the stanchion of the invention may be adapted to various sizes and dimensions to provide vertical mounting assembly of various elongated device packages on circuit boards.

The stanchion not only provides a convenient means for assuring vertical arrangement of the device package during assembly, it suspends the device package a finite distance from the surface of the circuit board so that solder flux, etc., may be readily cleaned from the circuit board after assembly. Furthermore, since the leads 24 pass through apertures 11 in the base 10, the base 10 acts as a barrier to prevent wicking of solder upwardly along leads 24.

Since the base 10 surrounding holes 11 will be in physical communication with the leads 24, at least base portion 10 of the stanchion must be electrically nonconductive. In the preferred embodiment, the entire stanchion is be made from electrically insulating material such as plastic or the like by conventional molding or stamping techniques.

While the invention has been described with specific reference to a preferred embodiment thereof, it will be understood that the form of the invention shown and described in detail is to be taken as the preferred embodiment of same and that various changes and modifications may be resorted to without departing from the spirit and scope of the invention as defined by the appended claims.

What is claimed:

1. The combination comprising:
   (a) a printed circuit board;
   (b) an electronic device package having an elongated body and a plurality of electrical leads extending from one end of said body; and
   (c) a free-standing stanchion for supporting said electronic device package in an upright position during attachment of said leads to said printed circuit board comprising:
      (i) a base portion having first and second oppositely disposed major faces with the first major face aligned substantially parallel with the surface of said aligned board and having a plurality of apertures passing through said base portion retaining said electrical leads therein; and
      (ii) attachment means extending from said second major face directly engaging said electrical device package and securing said one end of said electronic device package adjacent said second major face.

2. The combination set forth in claim 1 wherein said stanchion includes leg means spacing said base portion from the surface of said circuit board.

3. The combination set forth in claim 1 wherein said stanchion is made of electrically insulating material.

4. The combination set forth in claim 1 wherein said attachment means comprises elongated members extending along opposite sides of said electric device package.

5. The combination set forth in claim 4 wherein at least one of said elongated members includes hook means mating with an aperture in said electronic device package.

6. A free-standing stanchion for supporting an elongated electronic device package having leads extending from one end thereof in an upright position on the surface of a printed circuit board having connection means for electrical interconnection with the leads extending from the device package, said stanchion comprising:
   (a) a base portion having first and second oppositely disposed major faces and a plurality of apertures passing therethrough adapted to receive the leads extending from a device package and align said leads with said connection means; and
   (b) attachment means extending from said second major face adapted to directly engage said electronic device package and to secure the electronic device package to the stanchion with said leads extending through said holes.

7. A stanchion as defined in claim 6 including spacer means extending from said first major face of said base portion adapted to support said stanchion on the surface of a printed circuit board and maintain said first major face spaced from and substantially parallel with the surface of said circuit board.

8. A stanchion as defined in claim 6 wherein said attachment means comprises elongated means extending substantially parallel and adapted to mate with opposite sides of the electronic device package and secure the electronic device package therebetween.

9. A stanchion as defined in claim 8 wherein at least one of said elongated members includes hook means for securing the electronic device package to the stanchion.

* * * * *

UNITED STATES PATENT AND TRADEMARK OFFICE
CERTIFICATE OF CORRECTION

PATENT NO. : 4,962,442

DATED : October 9, 1990

INVENTOR(S) : Donald L. Clemens

It is certified that error appears in the above-identified patent and that said Letters Patent is hereby corrected as shown below:

Column 1, line 44, "free standing" should read ---free-standing---

Column 1, line 63, "red" should read ---preferred---

Column 2, line 4, "pan" should read ---plan---

Column 3, line 12, delete "10"

Column 4, line 27, "aligned" should read ---circuit---

Signed and Sealed this

Fourteenth Day of January, 1992

Attest:

HARRY F. MANBECK, JR.

*Attesting Officer*  *Commissioner of Patents and Trademarks*